March 14, 1961 N. C. DE TROYE 2,975,302

PULSE DELAY CIRCUIT

Filed March 27, 1958

INVENTOR
NICOLAAS CORNELIS DE TROYE

BY

AGENT

United States Patent Office 2,975,302
Patented Mar. 14, 1961

2,975,302

PULSE DELAY CIRCUIT

Nicolaas Cornelis De Troye, Eindhoven, Netherlands, assignor to North American Philips Company, Inc., New York, N.Y., a corporation of Delaware Filed Mar. 27, 1958, Ser. No. 724,419

Claims priority, application Netherlands Apr. 18, 1957

8 Claims. (Cl. 307—88.5)

In prior patent applications Serial Nos. 625,726 and 625,727, both filed December 3, 1956, there are described circuits in which transistors fulfil the function of memory elements. In order to obtain this memory effect, suitable use is made of the storage of free charge carriers in the base zone of the transistors, which storage is in most cases inconvenient and results from the inertia with which the free charge carriers diffuse through the base zone; this is from the so-called diffusion time-constant of the transistor, which is intimately related to the limiting frequency of its current gain factor.

In many test devices, in automation and especially in computers, it is frequently desirable for certain elements to be controlled with a predetermined delay with respect to the control of other elements. This may be achieved in different ways, for example by means of delay lines or monostable trigger circuits.

An object of the present invention is to provide a very simple circuit including a transistor, which is based on the phenomenon of the above-mentioned diffusion time-constant and which permits an electric voltage pulse to be delayed in an accurate and reliable manner for a time of the order of a few tenths of microseconds to a few tenths of milliseconds.

The circuit according to the invention is characterized in that a voltage pulse having a width greater than the desired delay and having a polarity corresponding to the blocking direction of the collector-base junction of the transistor is supplied via a load resistor to the emitter-collector path of the transistor, and that a comparatively short pulse to be delayed, the leading edge of which coincides in time with that of the wide pulse, is applied in the direction of passage between the emitter and the base of the transistor, so that the voltage of the wide pulse is initially set up almost completely across the load resistor and appears across said collector-emitter path after the charge carriers injected by the emitter during the short pulse have been drawn off.

The short pulse to be delayed may be derived, for example, directly from a source of control pulses, which controls a further source producing the wide pulses. However, it is preferably derived from the wide pulse by differentiation of the leading edge of the latter.

The delayed output pulse is derived from the voltage variation which occurs across the collector-emitter path of the transistor upon exhaustion of the free charge carriers in the base zone. The output pulse is preferably derived by differentiation of the voltage variation, for example by means of a resistance-capacitor network connected across the collector-emitter path of the transistor.

In order that the invention may be more readily carried into effect, it will now be described more fully, by way of example, with reference to the accompanying drawing, in which.

Figure 1:
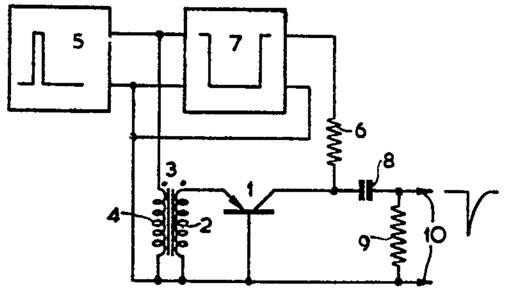
Fig. 1 shows diagrammatically a first embodiment of the pulse delay circuit according to the invention.

The first embodiment shown in Fig. 1 includes a transistor 1 in grounded-base connection. Connected between the base and the emitter of this transistor is the secondary winding 2 of a transformer 3, the primary winding 4 of which is connected to a pulse source 5. This source is, for example, a source of clock pulses or of other control pulses in a computer or in a test device. The positive pulses produced by this source are comparatively short, for example of a duration of 2 microseconds, and are supplied via transformer 3 to the emitter of transistor 1. The collector circuit of this transistor includes a load resistor 6, which is connected to the output terminals of a source 7 of negative pulses. This source is controlled by the source 5 of control pulses and supplies comparatively long pulses. It may be constituted, for example, by a monostable trigger. The collector of transistor 1 is thus fed, during the long pulses produced by the source 7, with a voltage having an amplitude equal to the amplitude of the output pulses of this source. Connected to the collector of transistor 1 is a differentiating network constituted by a coupling capacitor 8 and a parallel resistor 9, to which output terminals 10 of the circuit are connected.

Figure 2:
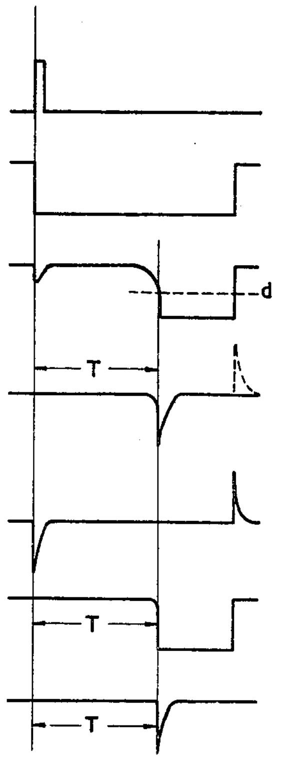
Fig. 2 shows time-voltage diagrams which serve to explain the operation of the circuit according to the invention.

The operation of the circuit shown in Fig. 1 will now be explained with reference to Fig. 2. The first line of Fig. 2 shows the short control pulse produced by the source 5 applied to the input terminals of source 7 and between the emitter and the base of transistor 1 via transformer 3. The second line shows the comparatively long negative pulse produced by source 7, the leading edge of which coincides in time with that of the control pulse represented on the first line. The third line of Fig. 2 shows the collector voltage of transistor 1. A comparatively large number of free charge carriers are injected in the base zone of transistor 1 by the positive control pulse applied to its emitter. At the same time, a reverse voltage is applied to the collector of the transistor from source 7 via load resistor 6. Since the transistor is strongly conducting from the start, substantially the whole voltage is set up across resistor 6 and its collector remains, for the time being and apart from a short and weak negative peak, substantially at earth potential. After the end of the positive control pulse, the transistor 1 remains conducting as a result of the free charge carriers accumulated in its base zone. Since it was strongly driven into its saturation range, its collector remains substantially at earth potential for a comparatively long time. It is not until all free charge carriers accumulated in the base zone of the transistor have been withdrawn therefrom, which action may be effected only via the resistor 6 of comparatively high value, that the collector voltage starts to decrease. After the end of the long pulse with which the collector circuit is fed, the collector of transistor 1 is suddenly brought again to earth potential. The leading and trailing edges of the collector voltage pulse as shown in the third line of Fig. 2 are differentiated by the network 8, 9, so that peaky and short pulses as shown in the fourth line of the same figure are produced. It is assumed that a device connected to the terminals 10 is sensitive only to negative pulses, or that the positive pulses are suppressed, for example by means of a diode connected in parallel to resistor 9. Under these conditions a delayed negative pulse is set up at the output terminals 10 by each of the positive control pulses produced by the source 5, the delay time T being dependent upon the diffusion time-constant of the transistor 1 and upon the value of resistor 6. This diffusion time-constant is substantially proportional to the reciprocal of the limiting frequency of the current gain factor of the transistor and hence, in the case shown to the limiting frequency of the collector-emitter current gain factor α. The resistor 6 is preferably variable, so that the desired delay can readily be adjusted and any differences between the limiting frequencies of different transistors may be compensated for.

Figure 3:
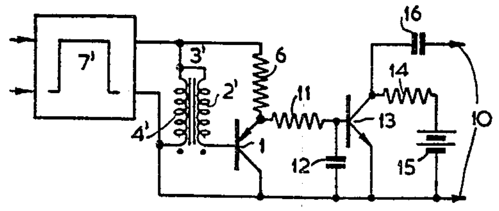
Figures 3 and 4 show the diagrams of two further embodiments.

The second embodiment shown in Fig. 3 includes a transistor 1 of the p-n-p type in grounded collector connection. The collector-emitter circuit of this transistor includes as before, a load resistor 6 and is fed by a source 7′ of comparatively long positive pulses. The base-emitter circuit includes the secondary winding 2′ of a transformer 3′, the primary winding 4′ of which is connected to the output terminals of source 7′. The transformer 3′ is proportioned with respect to the internal resistance of source 7′ and to the input resistance of transistor 1 so that the pulses produced by this source are stepped up and also differentiated. Pulses of the form shown in the fifth line of Fig. 2 are thus applied to the base of transistor 1. The leading edge of the first negative pulse applied to the base coincides in time with the leading edge of the positive pulse produced by the source 7′ which is applied between the collector and the emitter via resistor 6. The second positive pulse represented in the fifth line of Fig. 2 drives the transistor 1 in the cut-off direction and thus has no particular effect, since it coincides in time with the trailing edge of the positive pulse supplied by the source 7′. Connected to the emitter of transistor 1 is a coupling network comprising a series resistor 11 and a parallel capacitor 12, the common point of the network being connected to the base of a second transistor 13 of the n-p-n type. The network 11, 12 brings about a slight integration of the voltage pulses on the emitter of transistor 1. Due to this integration, the small and short negative pulse represented at the beginning of the third line of Fig. 2 is substantially suppressed. The transistor 13 is operated in grounded-emitter connection. Its collector circuit includes a load resistor 14 and a source of reverse voltage 15, the other terminal of which is connected to earth. The output terminals 10 are connected to earth and, via a coupling caapacitor 16, to the collector of transistor 13.

The second embodiment operates substantially in the same manner as the first, in which the source 7′ of comparatively long pulses is controlled by means of a source of comparatively short pulses. However, a difference resides in the fact that the comparatively short pulses for controlling the transistor 1 are obtained by differentiation of the comparatively long pulses. It would be possible to include a small threshold voltage-source in the emitter circuit of transistor 13, so that this transistor would be rendered conductive only by positive pulses having an amplitude greater than the threshold voltage. The form of the output pulses at the terminals 10 would thus be improved, as represented in the sixth line of Fig. 2. The negative output pulse represented on this line corresponds to that part of the pulse in the third line of Fig. 2 which is represented below a dotted line *d*.

Figure 4:
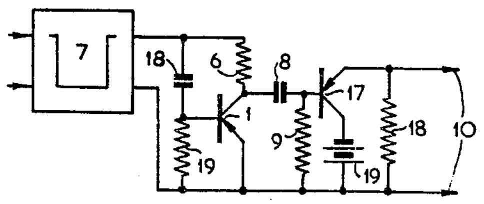

The third embodiment shown in Fig. 4 includes a transistor 1 of the p-n-p type in grounded-emitter connection. The collector circuit of this transistor includes a load resistor 6 and is fed with comparatively long negative pulses produced by a pulse source 7, which is controlled by a source of comparatively short pulses. As before, comparatively short control pulses are derived from the long pulses by means of a differentiating network comprising a capacitor 18 and a resistor 19. This circuit is connected to the output terminals of source 7, the base of transistor 1 being connected to the common point of capacitor 18 and resistor 19. This base electrode thus receives, via capacitor 18, comparatively short pulses of the form shown in the fifth line of Fig. 2. A second transistor 17 is coupled to the collector of transistor 1 via a second differentiating network. The second differentiating network comprises a series capacitor 8 and a parallel resistor 9, so that the base of transistor 17 is connected to earth. This transistor is operated in grounded-collector connection, so that its input impedance is comparatively high. Its emitter circuit includes a load resistor 14, to which the output terminals 10 are connected and its collector is connected to earth via a supply battery 15.

As before, negative pulses of the form represented in the third line of Fig. 2 are produced at the collector of transistor 1. By differentiation of these pulses, comparatively short and peaky pulses as shown in the fourth line of Fig. 2 are produced, only the negative pulse being transmitted by transistor 17, as shown in the last line of Fig. 2.

In the circuit shown in Fig. 3, in which the transistor is operated with grounded collector, the delay T is, as before, related to the limiting frequency of the collector-emitter current gain factor α of this transistor. In the circuit shown in Fig. 4, however, the delay T is related to the limiting frequency of the collector-base current gain factor α′ of transistor 1. Consequently, in the latter case, much greater delays can be obtained.

The circuits described operate in a satisfactory and very reliable manner. With the circuit shown in Fig. 4, there was found, for example with twenty transistors of the same type, a mean spread of the delay T of 5% with maximum deviations of −8% and +6%. By varying the load resistor 6 the delays obtained could readily be given the same value and varied between 10 and 60 microseconds. With another type of transistor, it was possible to obtain delays of from 1 to 10 microseconds. In each case, the adjusted delay time T was very stable.

What is claimed is:

1. In a pulse delay circuit having a desired delay period including a junction transistor having base, emitter, and collector electrodes, means for applying a first comparatively wide voltage pulse to the series connection of the emitter-collector path of the transistor and a load resistor therefor, said first voltage pulse having a width greater than the desired delay of the circuit and a polarity corresponding to the blocking direction of the collector-base junction of the transistor, means for applying a second comparatively short voltage pulse between the emitter and the base of the transistor, the leading edge of said second voltage pulse corresponding substantially in time with the leading edge of said first voltage pulse, and means for deriving a delayed voltage pulse having said desired delay across said collector-emitter path, said delayed voltage pulse occurring after the charge carriers injected by the emitter into the base have been drawn off.

2. A circuit as claimed in claim 1, said second voltage pulse being produced by differentiation of the leading edge of said first voltage pulse.

3. A circuit as claimed in claim 1, said delayed voltage pulse deriving means including differentiating means for differentiating the voltage variation appearing across the collector-emitter path upon exhaustion of the charge carriers, thereby producing a comparatively short delayed voltage pulse.

4. A circuit as claimed in claim 2, said delayed voltage pulse deriving means including differentiating means for differentiating the voltage variation appearing across the collector-emitter path upon exhaustion of the charge carriers, thereby producing a comparatively short delayed voltage pulse.

5. A circuit as claimed in claim 2, the base electrode of the transistor being connected through a conducting impedance to the emitter electrode and through a capacitor to one terminal of the source of said first voltage pulses, said collector electrode also being connected to said one terminal through said resistor means.

6. A circuit as claimed in claim 3, further comprising a resistance-capacitance network connected across the collector-emitter path of said transistor.

7. A circuit as claimed in claim 5, further comprising a resistance, capacitance network connected across the collector-emitter path of said transistor.

8. A pulse delay circuit having a predetermined delay period, including a junction transistor having base, emitter and collector electrodes comprising a pulse input circuit and a pulse output circuit, resistor means for applying a first comparatively wide voltage pulse to said pulse output circuit, said first voltage pulse having a width greater than said predetermined delay period and a polarity corresponding to the blocking direction of the collector-base junction of the transistor, means for applying a second comparatively short voltage pulse to said pulse input circuit, the front flanks of said first and second voltage pulse occurring substantially simultaneously, and means for deriving a delayed voltage pulse having said predetermined delay from said output circuit, said delayed voltage pulse occurring at a time predetermined by the value of said resistor means and the diffusion time-constant of said transistor.

References Cited in the file of this patent

UNITED STATES PATENTS

| | | |
|---|---|---|
| 2,106,793 | Burton | Feb. 1, 1938 |
| 2,414,475 | Marchand | Jan. 21, 1947 |
| 2,430,315 | Varnum | Nov. 4, 1947 |
| 2,787,717 | Kasmir | Apr. 2, 1957 |
| 2,809,239 | Nielsen | Oct. 8, 1957 |
| 2,889,469 | Green | June 2, 1959 |
| 2,892,164 | Woll | June 23, 1959 |
| 2,892,165 | Lindsay | June 23, 1959 |
| 2,906,926 | Bauer | Sept. 29, 1959 |